United States Patent [19]

Coffey et al.

[11] Patent Number: 5,452,163
[45] Date of Patent: Sep. 19, 1995

[54] MULTILAYER MAGNETORESISTIVE SENSOR

[75] Inventors: Kevin R. Coffey; Robert E. Fontana, both of San Jose; James K. Howard, Morgan Hill; Todd L. Hylton, San Jose; Michael A. Parker, Fremont; Ching H. Tsang, Sunnyvale, all of Calif.

[73] Assignee: International Business Machines Corporation, Armonk, N.Y.

[21] Appl. No.: 173,590

[22] Filed: Dec. 23, 1993

[51] Int. Cl.⁶ ............................................... G11B 5/30
[52] U.S. Cl. .................................................... 360/113
[58] Field of Search .......................................... 360/113

[56] References Cited

U.S. PATENT DOCUMENTS

| | | | |
|---|---|---|---|
| 4,896,235 | 1/1990 | Takino et al. | 360/113 |
| 4,914,538 | 4/1990 | Howard et al. | 360/113 |
| 4,949,039 | 8/1990 | Grunberg | 324/252 |
| 5,206,590 | 4/1993 | Dieny et al. | 324/252 |
| 5,327,313 | 7/1994 | Nishioka et al. | 360/113 |
| 5,337,203 | 8/1994 | Kitada et al. | 360/113 |
| 5,343,422 | 8/1994 | Kung et al. | 360/113 X |

OTHER PUBLICATIONS

G. Binasch et al., "Enhanced magnetoresistance in layered magnetic structures with antiferromagnetic interlayer exchange", Physical Review B, vol. 39, No. 7, Mar. 1989, pp. 4828–4830.

B. Dieny et al., "Giant magnetoresistance in soft ferromagnetic multilayers", Physical Review B. vol. 43, No. 1, Jan. 1991, pp. 1297–1300.

J. Ziao et al., "Giant Magnetoresistance in Nonmultilayer Magnetic Systems", Physical Review Letters, vol. 68, No. 25, Jun. 1993, pp. 3749–3752.

A. Berkowitz et al., "Giant Magnetoresistance in Heterogeneous Cu–Co Alloys", Physical Review Letters, vol. 68, No. 25, Jun. 1992, pp. 3745–3748.

M. Baibich et al., "Giant Magnetoresistance of (001)Fe/(001)Cr Magnetic Superlattices", Physical Review Letters, vol. 61, No. 21, Nov. 1988, pp. 2472–2475.

J. Slonczewski et al., "Micromagnetics of Laminated Permalloy Films", IEEE Trans. on Magnetics, vol. 24, No. 3, May 1988, pp. 2045–2054.

*Primary Examiner*—John H. Wolff
*Attorney, Agent, or Firm*—Leslie G. Murray

[57] ABSTRACT

A magnetoresistive read sensor incorporates a multilayer sensing element formed of one or more magnetoresistive elements in a planar array, each magnetoresistive element having a multilayer structure of at least two ferromagnetic layers separated by a nonmagnetic layer. The ferromagnetic layers are coupled antiferromagnetically by magnetostatic coupling at opposing edges of the ferromagnetic layers. A bias layer separated from the magnetoresistive sensing element by a spacer layer provides a magnetic field to bias the magnetoresistive sensing element at a desired non-signal point for linear response. The magnetoresistive sensing element is formed by alternatively depositing layers of ferromagnetic material and layers of nonmagnetic material on a substrate and then patterning the resulting structure using photolithographic techniques to provide a planar array of magnetoresistive elements. A conductive layer is deposited over the array filling in the spaces separating the magnetoresistive elements to provide electrical conductivity between the elements in the plane of the structure.

89 Claims, 9 Drawing Sheets

MULTILAYER MAGNETORESISTIVE SENSOR

BACKGROUND OF THE INVENTION

The present invention relates generally to magnetic transducers for reading information signals recorded in a magnetic medium and, more particularly, to a magnetoresistive read sensor based on the giant magnetoresistance exhibited by multilayered ferromagnetic structures wherein the ferromagnetic layers are antiferromagnetically coupled.

It is well-known in the prior art to utilize a magnetic read transducer referred to as a magnetoresistive (MR) sensor or head for reading high density recorded data from magnetic media. An MR sensor detects magnetic field signals through the resistance changes of a read element fabricated of a magnetic material as a function of the strength and direction of imagnetic flux being sensed by the read element. These prior art MR sensors operate on the basis of the anisotropic magnetoresistive (AMR) effect in which a component of the read element resistance varies as the square of the cosine ($cos^2$) of the angle between the magnetization and the direction of sense current flow through the read element. A more detailed description of the AMR effect can be found in "Memory, Storage, and Related Applications", D. A. Thompson et al., IEEE Trans. Mag. MAG-11, p. 1039 (1975).

U.S. Pat. No. 4,896,235 entitled "Magnetic Transducer Head Utilizing Magnetoresistance Effect", granted to Takino et al on Jan. 23, 1990, discloses a multilayered magnetic sensor which utilizes the AMR and comprises first and second magnetic layers separated by a non-magnetic layer in which at least one of the magnetic layers is of a material exhibiting the AMR effect. The easy axis of magnetization in each of the magnetic layers is set perpendicular to the applied magnetic signal such that the MR sensor element sensor current provides a magnetic field in the magnetic layers parallel to the easy axis thus eliminating or minimizing Barkhausen noise in the sensor. "Thin Film MR Head for High Density Rigid Disk Drive" by H. Suyama et al, IEEE Trans. Mag., vol. 24, No. 6, 1988 (pages 2612–2614) discloses a multilayered MR sensor similar to that disclosed by Takino et al.

Magnetoresistive read sensors utilizing the AMR effect are generally superior to inductive sensors for a number of reasons, the most noteworthy being the larger signal and signal to noise ratio independent of relative motion between the sensor and magnetic media. However, at data recording densities greater than 5 gigabits/$in^2$, it is expected that AMR sensors will provide insufficient sensitivity. The loss of signal strength at these densities is due largely to the thinning of the MR sensor stripe required at higher recording densities. Additionally, the AMR effect diminishes rapidly for sensor stripe thickness less than 10 nanometers (nm); for example, at a thickness of 3 nm, the deltaR/R is about 0.5 percent.

A second, different and more pronounced magnetoresistive effect has also been described in which the change in resistance of a layered magnetic sensor is attributed to the spin-dependent transmission of conduction electrons between ferromagnetic layers via a nonmagnetic layer separating the ferromagnetic layers and the accompanying spin-dependent scattering at the layer interfaces. This magnetoresistive effect is variously referred to as the "giant magnetoresistive" or "spin valve" effect. Such a magnetoresistive sensor fabricated of the appropriate materials provides improved sensitivity and greater change in resistance than observed in sensors utilizing the AMR effect. In this type of MR sensor, the in-plane resistance between a pair of ferromagnetic layers separated by a non-magnetic layer varies as the cosine (cos) of the angle between the magnetization in the two layers.

In a paper entitled "Enhanced Magnetoresistance in Layered Magnetic Structures with Antiferromagnetic Interlayer Exchange" The American Physical Society, Physical Review B, Vol. 39, No. 7, 1 Mar. 1989, G. Binasch et al describe a strong increase of the magnetoresistance effect as a result of antiferromagnetic exchange coupling between adjacent layers of iron separated by a thin nonmagnetic interlayer of chromium. U.S. Pat. No. 4,949,039 to Grunberg describes a layered magnetic structure which yields enhanced MR effects caused by antiparallel alignment of the magnetizations in the magnetic layers. As possible materials for use in the layered structure, Grunberg lists ferromagnetic transition metals and alloys, but does not indicate preferred materials from the list for superior MR signal amplitude.

U.S. Pat. No. 5,206,590, assigned to the instant assignee, discloses an MR sensor in which the resistance between two adjacent ferromagnetic layers separated by a thin layer of nonmagnetic material is observed to vary as the cosine of the angle between the magnetizations of the two layers and which is independent of the direction of current flow through the sensor. This mechanism produces a magnetoresistance that is based on the spin valve effect and, for selected combinations of materials, is greater in magnitude than the AMR.

The spin valve structures described in the above-cited U.S. patent require that the direction of magnetization in one of the two ferromagnetic layers be fixed or "pinned" in a selected orientation such that under non-signal conditions the direction of magnetization in the other ferromagnetic layer is oriented perpendicular to the pinned layer magnetization. Additionally, in both the AMR and spin valve structures, in order to minimize Barkhausen noise, it is necessary to,provide a longitudinal bias field to maintain at least the sensing portion of the read element in a single magnetic domain state. Thus, a means for both fixing the direction of the magnetization and providing a longitudinal bias field is required. For example, as described in the above-cited patent application and patents, an additional layer of antiferromagnetic material can be formed in contact with the ferromagnetic layer to provide an exchange-coupled bias field. Alternatively, an adjacent magnetically hard layer can be utilized to provide hard bias for the ferromagnetic layer.

SUMMARY OF THE INVENTION

Thus, it is a principal object of the present invention to provide a low field MR magnetic sensor based on the GMR effect in multilayer structures.

Another object of the present invention is to provide an MR sensor in which it is not required to provide additional structure means for fixing the magnetization orientation in one or more ferromagnetic layers or to provide a longitudinal bias field for the field sensing element.

These and other objects and advantages are attained in accordance with the principles of the present invention, in which an MR read sensor incorporating a multilayer MR sensing element comprises a layered structure formed on a suitable substrate including a magnetoresistive sensing element comprising a plurality of layers of ferromagnetic material, each ferromagnetic layer separated from the adjacent layer by a layer of nonmagnetic electrically conductive material. The MR sensing element is formed by alternatively depositing layers of ferromagnetic material and layers of nonmagnetic conductive material on a substrate, over suitable isolation and protective underlayers. The multilayer structure is also capped with a protective layer. In a preferred embodiment, thin films having alternating magnetic and nonmagnetic layers are prepared by magnetron sputtering techniques. When deposition is complete, the resulting thin film structure is patterned using photolithographic techniques to form an array of "dot-like" structures on the substrate surface. The dots have a major dimension of approximately 2 micrometers ($\mu$m) or less and are separated by approximately 2 $\mu$m. An MRS sensor read element comprises a single or a few of the dot-like structures. Weak antiferromagnetic coupling between the ferromagnetic layers in each of the dot structures provides antiparallel alignment of the magnetization in each ferromagnetic layer with respect to the adjacent ferromagnetic layer. A current source provides a sense current to the MR sensor which generates a voltage drop across the sensing element proportional to the variations in the resistance of the MR sensor due to the rotation of the magnetic moments in the ferromagnetic layers as a function of the applied external magnetic field being sensed. The resistance of the MR sensor varies as the cosine of the angle between the magnetizations of two adjacent ferromagnetic layers. The resistance is a maximum when the magnetizations of the ferromagnetic layers are aligned antiparallel, i.e., in opposite directions. The resistance is a minimum when the magnetizations of the ferromagnetic layers are aligned parallel, i.e., in the same direction.

Thus, the present invention provides an MR sensor in which the magnetoresistive sensing element constitutes a plurality of adjacent magnetic layers separated by a nonmagnetic spacer layer in which the individual magnetic moments rotate in response to an applied magnetic signal. Since the response is the result of the rotation of the magnetic moments with limited domain wall motion, the need for a longitudinal bias field to minimize Barkhausen noise is eliminated.

BRIEF DESCRIPTION OF THE DRAWINGS

The foregoing and other objects, features and advantages of the present invention will be apparent from the following detailed description of the preferred embodiments of the invention, reference being made to the accompanying drawings, in which like reference numerals indicate like parts and in which.

DETAILED DESCRIPTION OF THE PREFERRED EMBODIMENTS

Figure 1:
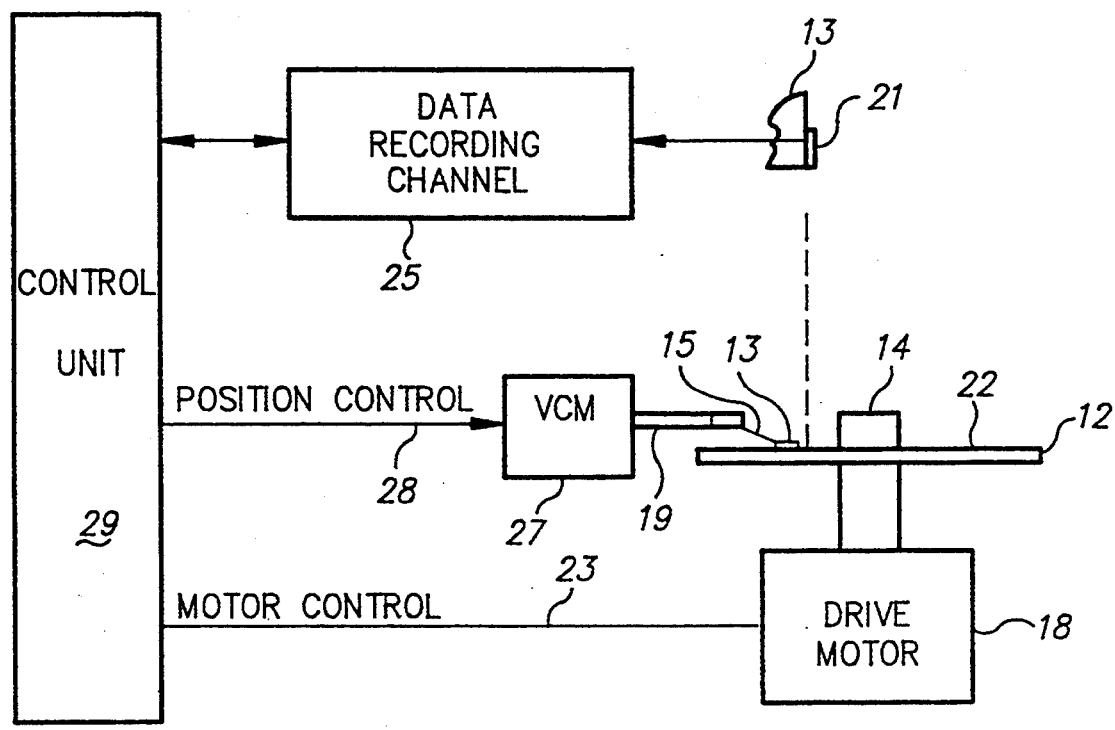
FIG. 1 is a simplified block diagram of a magnetic disk storagesystem embodying the present invention.

Referring now to FIG. 1, although the invention is described as embodied in a magnetic disk storage system as shown in FIG. 1, it will be apparent that the invention is also applicable to other magnetic recording systems such as a magnetic tape recording system, for example, or other applications in which a sensor is utilized to detect a magnetic field. A magnetic disk storage system comprises at least one rotatable magnetic disk 12 supported on a spindle 14 and rotated by a disk drive motor 18 with at least one slider 13 positioned on the disk 12, each slider 13 supporting one or more magnetic read/write transducers 21, typically referred to as read/write heads. The magnetic recording media on each disk is in the form of an annular pattern of concentric data tracks (not shown) on disk As the disks rotate, the sliders 13 are moved radially in and out over the disk surface 22 so that the heads 21 may access different portions of the disk where desired data is recorded. Each slider 13 is attached to an actuator arm 19 by means of a suspension 1b. The suspension 1b provides a slight spring force which biases the slider 13 against the disk surface 22. Each actuator arm 19 is attached to an actuator means 27. The actuator means as shown in FIG. 1 may be a voice coil motor (VCM), for example. The VCM comprises a coil moveable within a fixed magnetic field, the direction and velocity of the coil movements being controlled by the motor current signals supplied by a controller.

During operation of the disk storage system, the rotation of the disk 12 generates an air bearing between the slider 13 and the disk surface 22 which exerts an upward force or lift on the slider. The air bearing thus counterbalances the slight spring force of the suspension 15 and supports the slider 13 off and slightly above the disk surface by a small, substantially constant spacing during operation.

The various components of the disk storage system are controlled in operation by control signals generated by control unit 29, such as access control signals and internal clock signals. Typically, the control unit 29 comprises logic control circuits, storage means and a microprocessor, for example. The control unit 29 generates control signals to control various system operations such as drive motor control signals on line 23 and head position and seek control signals on line 28. The control signals on line 28 provide the desired current profiles to optimally move and position a selected slider 13 to the desired data track on the associated disk 12. Read and write signals are communicated to and from read/write heads 21 by means of recording channel 25.

The above description of a typical magnetic disk storage system, and the accompanying illustration of FIG. 1 are for representation purposes only. It should be apparent that disk storage systems may contain a large number of disks and actuators, and each actuator may support a number of sliders.

Figure 2B:
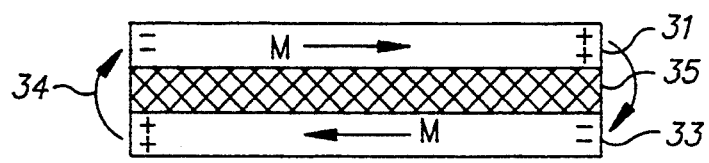
FIGS. 2a and 2b are diagrams illustrating a multilayered magnetoresistive structure according to the principles of the present invention.
Figure 2A:
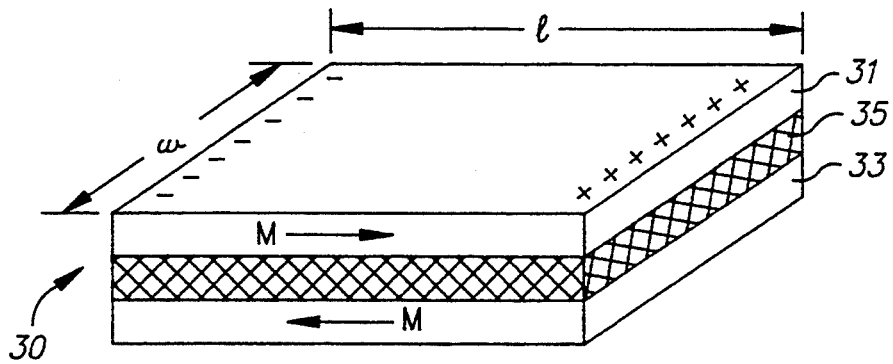
Figure 3:
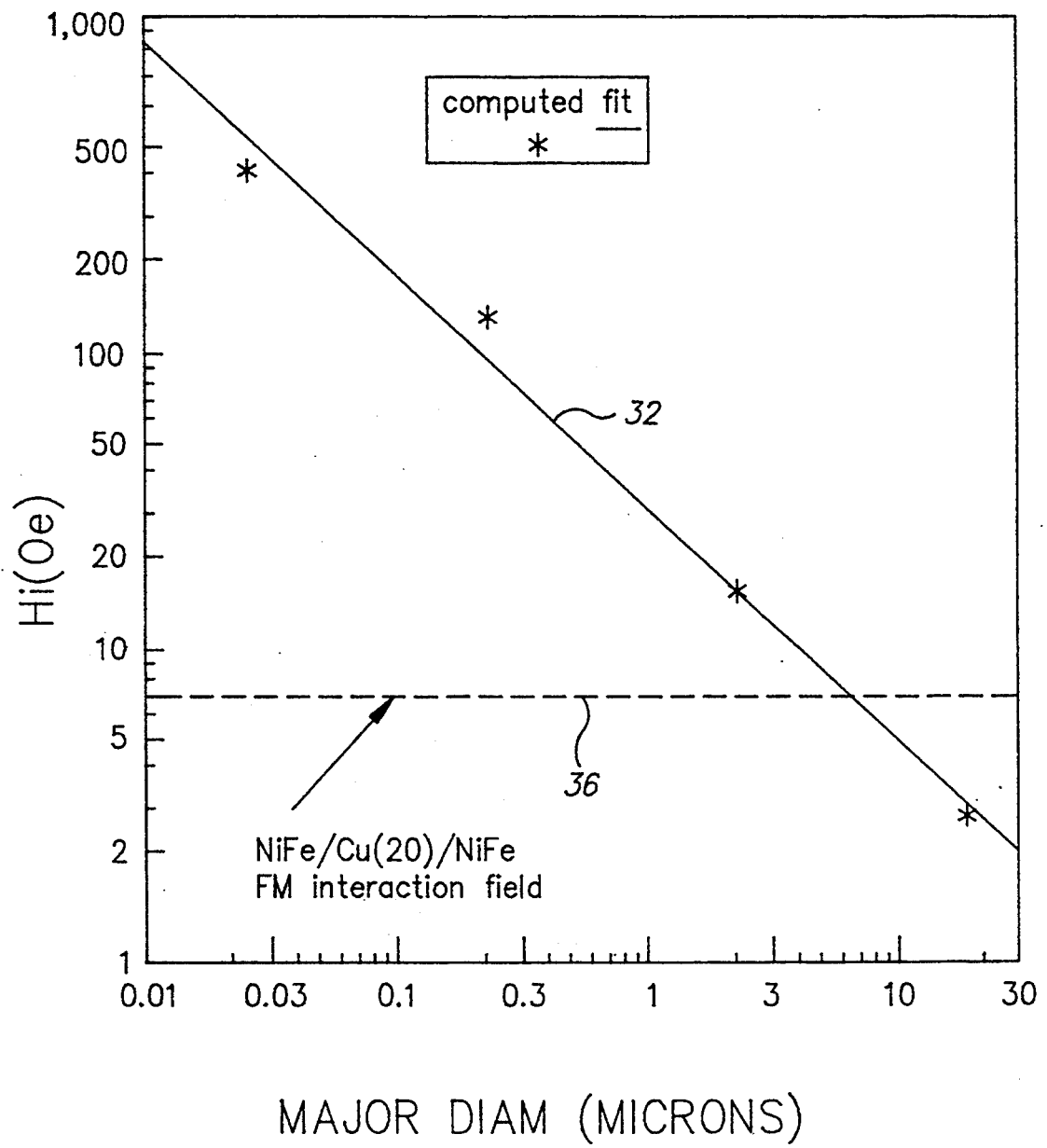
FIG. 3 is a graph illustrating the antiferromagnetic interaction field strength as a function of the magnetoresistive dot structure major axis length for a computer model of a preferred embodiment of the magnetoresistive sensing element shown in FIG. 2.

Referring now to FIGS. 2a, 2b and 3, FIG. 2a is a perspective view illustrating a multilayer magnetic structure 30 comprising two layers 31, 33 of magnetic material separated by a layer 35 of a nonmagnetic material. The nonmagnetic layer 35 can be either an electrically conductive material or a layer of an insulating material thin enough to allow transmission of conduction electrons between the layers of magnetic material by the tunneling mechanism. The magnetic layers 31, 33 are of a ferromagnetic material such as nickel (Ni), iron (Fe) or cobalt (Co) or alloys thereof, such as NiFe (permalloy), for example. The layers of magnetic and nonmagnetic material are alternatively deposited, such as by sputter deposition, with the thickness of the individual layers being controlled by a quartz monitor, for example. The lateral dimensions of the magnetic structure 30 can be several μm, but preferably are about 2.0 μm or less. The thickness of the magnetic layers 31, 33 is in the range of 10 to 100 Angstroms (Å) while the thickness of the nonmagnetic layer 35 is in the range of 10 to 400Å.

Typically, multilayered magnetic structures, such as shown in FIGS. 2a and 2b, for example, exhibit a relatively large interlayer magnetic coupling that oscillates from ferromagnetic to antiferromagnetic as the thickness of the spacer layer varies with a period of about 1 nm. Practical MR sensors utilizing this exchange coupling are difficult to fabricate because the exchange coupling is large and because it is extremely sensitive to layer thickness variations. On the other hand, in ferromagnetic materials at temperatures below the Curie temperature the magnetic moments within domains are aligned parallel resulting in positive or north poles at one edge of a layer and negative or south poles at an opposite edge, as shown by plus and minus signs, respectively in FIG. 2. This results in a weak antiferromagnetic coupling between adjacent layers as indicated by arrows 34 due to magnetostatic interactions rather than exchange interactions. The net interaction field is the sum of the magnetostatic and exchange interactions. If the exchange interaction is ferromagnetic then it will partially or completely cancel the magnetostatic interaction, which is always antiferromagnetic. Antiferromagnetic order and GMR will be achieved only if the net interaction field is antiferromagnetic.

Control of the interaction field can be accomplished by several methods. Typically, the magnitude of the exchange interaction varies with the composition and thickness of the magnetic layers and the spacer layers. In general, thicker spacer and magnetic layers lead to smaller exchange interaction fields. Additionally, as the physical size of a structure, the length 1 and width w as shown in FIG. 2a, for example, decreases, the strength of the antiferromagnetic field due to magnetostatic coupling increases. FIG. 3 illustrates the strength of the antiferromagnetic interaction field, curve 32, and the ferromagnetic exchange field, curve 36, versus size for a magnetic structure of two adjacent 20 Å layers of NiFe separated by a 20 Å layer of Cu. For the example illustrated in FIG. 3, the antiferromagnetic interaction field 32 is approximately equal to the ferromagnetic interaction field 36 at a major dimension for the particle of about 6 μm. For particles having a major dimension less than 6 μm, the net interaction field will always be antiferromagnetic insuring antiparallel alignment of the magnetizations in adjacent ferromagnetic layers as indicated by arrows M in FIGS. 2A and 2B.

Curve 32 of FIG. 3 is the result of a model computation which assumes two oblate spheroidal particles stacked on top of each other separated by a spacer layer of 20 Å along the central axis of the spheroidal particles and a magnetization that is uniform and parallel to the major axis in each particle. The minor axis length, i.e., the thickness, of each particle is 20 Å. The interaction field strength is plotted versus the major diameter of the particle. The antiferromagnetic interaction field strength increases as the major diameter decreases because the relative influence of the layer edges increases as the particle becomes less oblate. A similar, although inverse relationship is observed between the magnitude of the antiferromagnetic field strength and the thickness of the particle. The physical parameter of importance is the thickness to diameter ratio. Additionally, particles having identical thickness to diameter ratios produce approximately the same magnetostatic field strength. For example, a pair of particles 2 μm wide and 20 Å thick produces a magnetostatic field strength of about 15 Oersted (Oe) (from FIG. 3); similarly, a pair of particles 1 μm wide and 10 Å thick will also produce a magnetostatic field strength of about 15 Oe.

Figure 4:
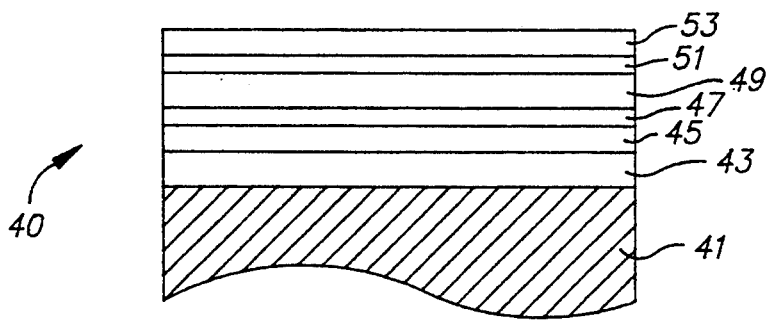
FIG. 4 is a cross-sectional view illustrating a preferred embodiment of a multilayer magnetoresistive structure according to the principles of the present invention.
Figure 5:
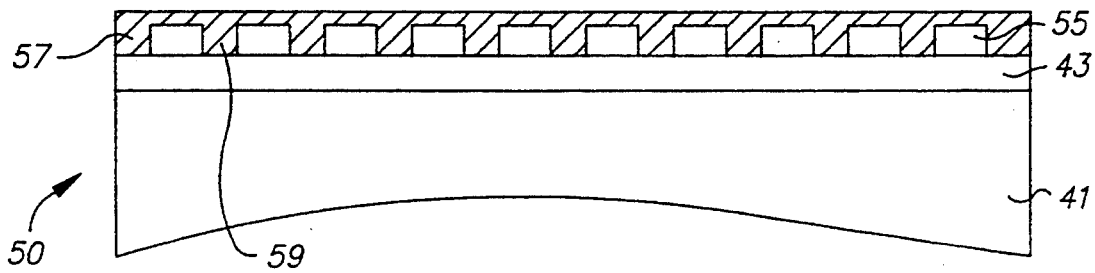
FIG. 5 is a cross-sectional view of a preferred embodiment of a multilayer magnetoresistive sensing element according to the principles of the present invention.

Referring now also to FIGS. 4, 5, and 6, a multilayered magnetic structure 40 according to the principles of the present invention comprises two adjacent layers 47, 51 of ferromagnetic material separated by a spacer layer 49 of nonmagnetic material, a capping layer 53 and an underlayer 45 deposited on a layer 43 silica (SiO$_2$) over a suitable substrate 41. For example, a preferred embodiment has the structure Ta(50Å)/NiFe(120Å)/Ag(40Å)/NiFe(20Å)/Ta (40Å)/SiO$_2$ (700Å)/Si. The Ta capping layer 53 protects the magnetic layers from corrosion and other undesirable affects which may result from exposure to the atmosphere or subsequent processing. The Ta underLayer 45 prepares the silica layer 43 surface for the deposition of the magnetic layer 47 and also promotes the formation of the desired crystalline and magnetic properties in the magnetic layer. Depending on the materials used for the magnetic layers, one or both of the capping layer and underlayer may not be required.

Figure 6A:
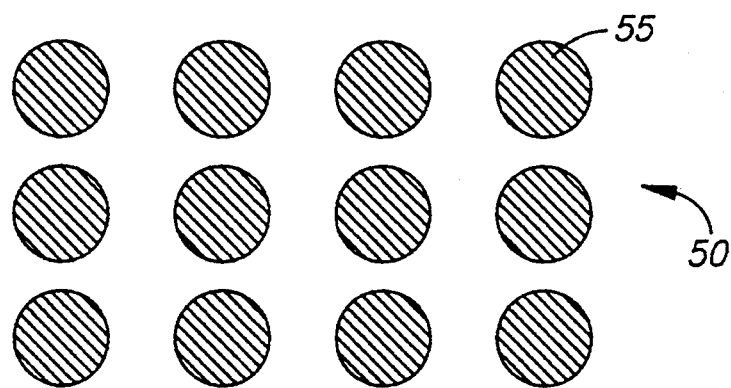
FIGS. 6A and 6B are planar views illustrating preferred embodiment of the multilayer magnetoresistive sensing element shown in FIG. 5.
Figure 6B:
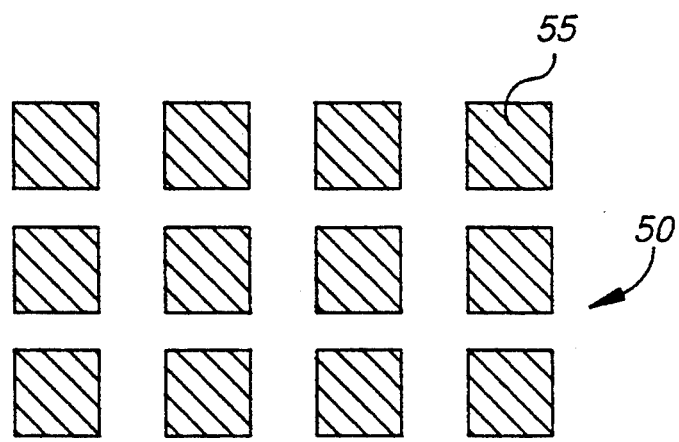

The layered magnetic structure 40 is then patterned and etched as shown in FIG. 5 to produce a planar dot an array 50 as of generally circular or rectangular dots 55 illustrated in FIG. 6A and 6B. The magnetic structure is etched down to the Surface of the silica layer 43 to form an array of magnetic dots 55 wherein each dot has the layered structure shown in FIG. 4. A conduction layer 57 of an electrically conductive material is then deposited over the dot array filling in the spaces 59 between the dots 55 to provide electrical conductivity through the structure. The major dimension (diameter) of the dots 55 is preferably 2.0 µm or less. While FIGS. 5 and 6 show the separation between the dots 55 to be on the order of the dot diameter, the dots are preferably as close together as practically achievable without being in physical contact and providing sufficient separation to provide the desired magnetostatic coupling between ferromagnetic layers at the edges. If the dots 55 are in contact or are not separated sufficiently, undesirable exchange or magnetostatic interactions may occur resulting in low signal to noise and reduced sensitivity. The patterned dot array 50 can be produced using well-known photolithography and etching techniques such as ion milling (RIE) or wet etching.

Figure 7A:
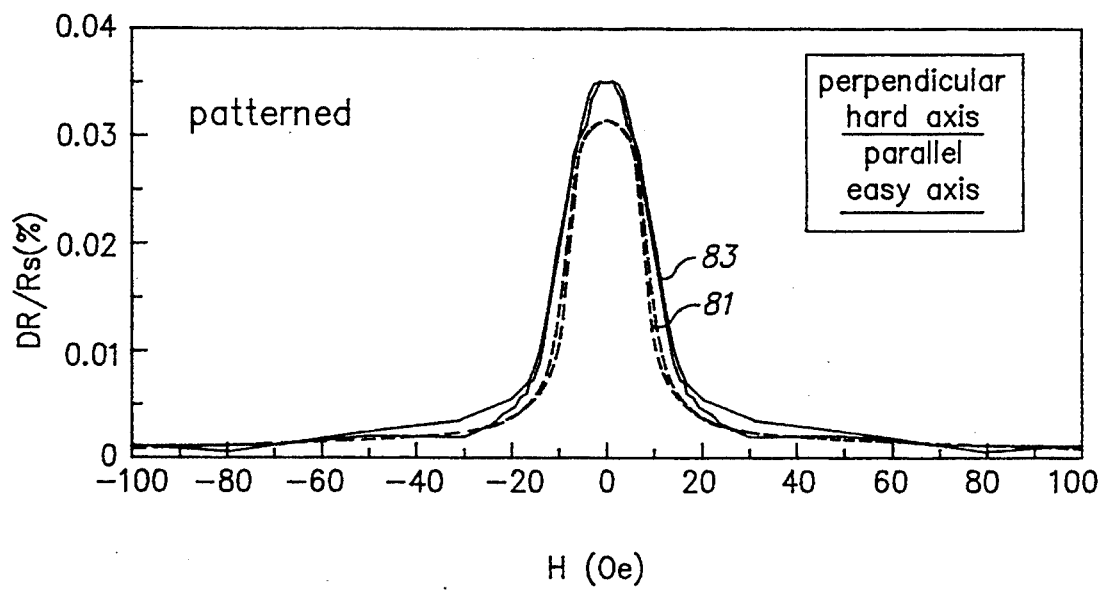
FIGS. 7a and 7b are graphs illustrating the magnetoresistance versus an applied magnetic field for a patterned and an unpatterned, respectively, embodiment of the magnetoresistive sensing element shown in FIG. 4.
Figure 7B:
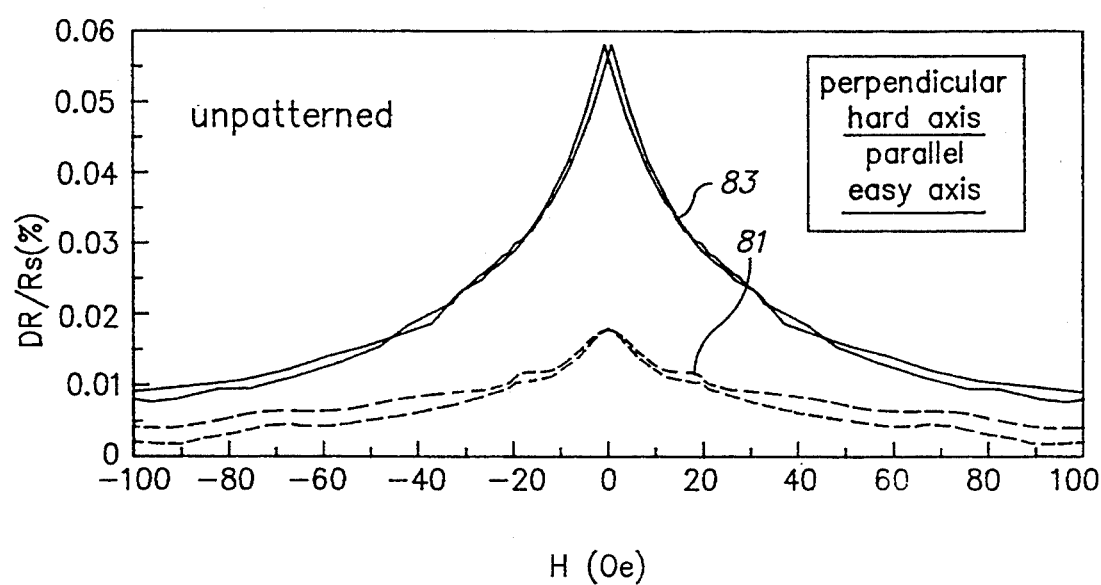
Figure 8A:
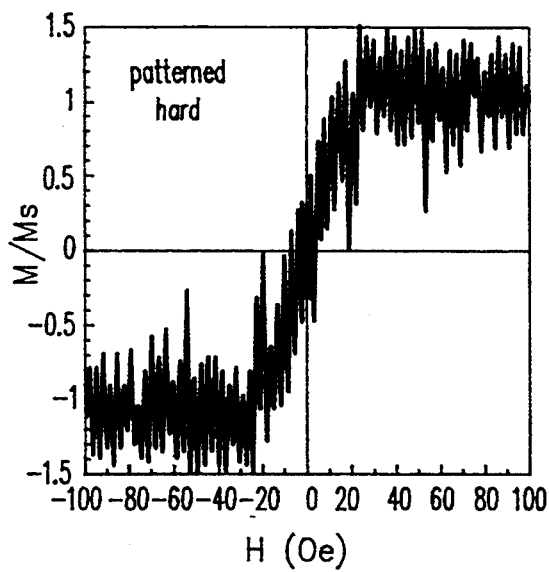
FIGS. 8a–8d are graphs illustrating the magnetization versus an applied magnetic field in the easy axis and the hard axis directions for a patterned and an unpatterned embodiment of the magnetoresistive sensing element shown in FIG. 4.
Figure 8B:
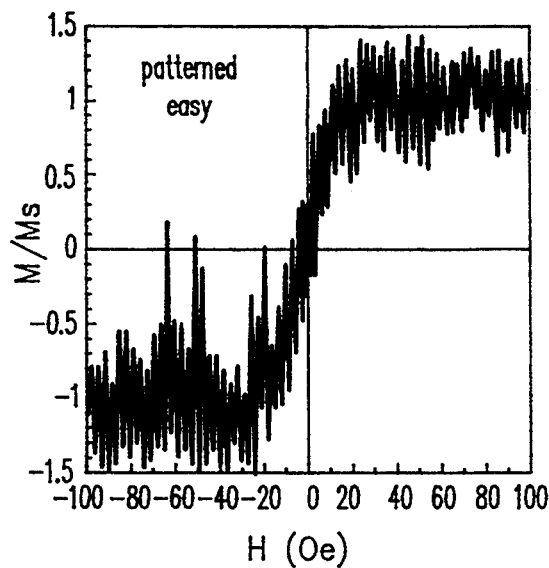
Figure 8C:
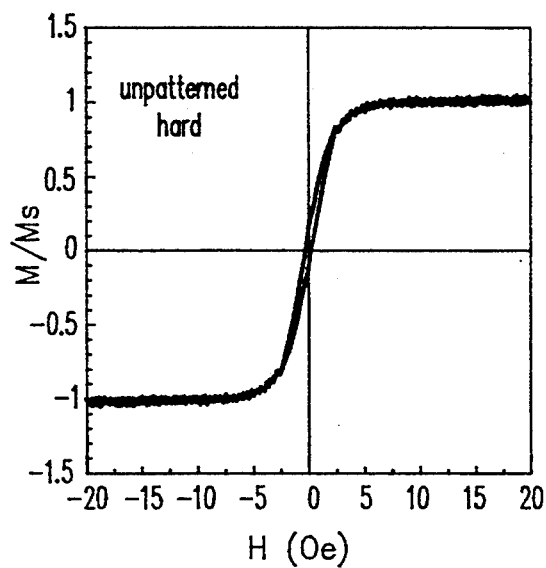
Figure 8D:
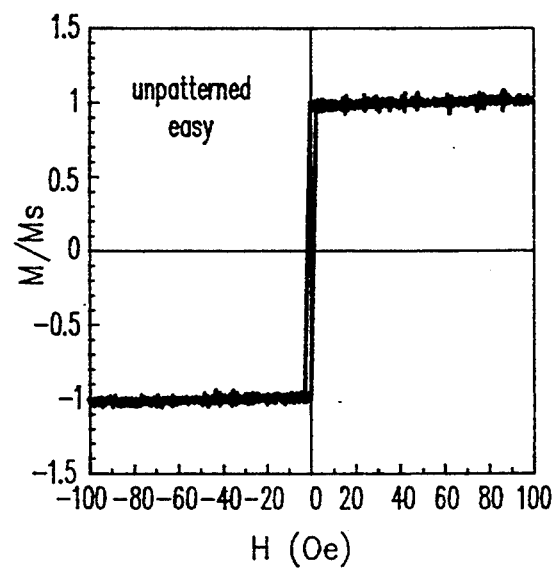

Referring now also to FIGS. 7 and 8, test samples comprising magnetic films having the multilayer structure, materials and dimensions as discussed above and having a 500 Å overlayer 57 of tantalum (Ta) were prepared and the magnetoresistance measured. FIG. 7a plots the magnetoresistance versus applied magnetic field strength along both the magnetic hard and easy axes for a patterned film 50 wherein the overlayer of Ta served as the conduction layer. Similarly, FIG. 7b is a plot of the magnetoresistance versus the applied magnetic field strength along both the magnetic hard and easy axes for an unpatterned film 40. The anisotropic MR effect (AMR) is the difference in the parallel and perpendicular curves 81 and 83, respectively. The giant MR effect (GMR) is the average of the two curves 81, 83. The unpatterned film 40 exhibits a predominantly AMR effect with a small GMR component. In contrast, the patterned film 50 exhibits a predominantly GMR effect with a small AMR component. The patterned film exhibits little or no hysteresis while the unpatterned film exhibits substantial hysteresis along the easy axis. The measured magnitude of the MR effect in both the patterned and unpatterned test films is small because of current shunting from the Ta overlayer and poor electrical contact between the magnetic multilayer structure and the Ta overlayer. These are processing problems that are easily resolved in practical MR sensor devices. In unpatterned, overlayered magnetic films of the same or similar structure, it is known that the magnitude of the AMR effect is about 0.2 to 0.4 percent. In the patterned test film 50, the AMR effect is approximately 7.6 percent of the GMR effect, which implies a GMR effect of 2.5 to 5.0 percent. The magnitude of the MR effect, deltaR/R, exhibited by the multilayer structure is largely determined by the choice of materials used in and the thickness of the magnetic and nonmagnetic layers.

FIGS. 8a, 8b, 8c and 8d plot magnetization (M/M$_S$) versus the applied field strength (H) in the hard and easy axis direction for the patterned film 50 and the unpatterned film 40, respectively. Since the quantity of magnetic material measured in the test films was extremely small, a significant amount of background noise is observed with the measured date, especially with the patterned film 50. The unpatterned film 40 exhibits a typical hard and easy axis hysteresis loop for a ferromagnetically coupled multilayer structure with an induced anisotropy field of about 3 Oe. The data for the dot array patterned film 50, however, is characteristic of an antiferromagnetically ordered multilayer structure with an interaction field (equivalent to the saturation field) of approximately 20 Oe, which is consistent with the saturation field of the magnetoresistance curves shown in FIGS. 7a and 7b. Little or no hysteresis and a nearly linear dependence of M/M$_S$ on H, particularly along the hard axis, was observed for all of the patterned test films examined. The data shown by FIGS. 7a and 7b suggest that the magnetic layers are single magnetic domains.

Figure 9A:
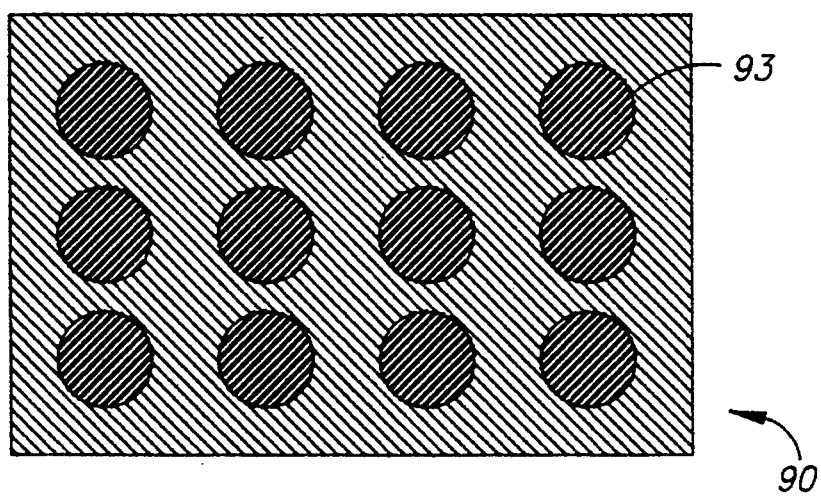
FIGS. 9a and 9b are planar views illustrating additional embodiments of the multilayer magnetoresistive sensing element shown in FIG. 5.
Figure 9B:
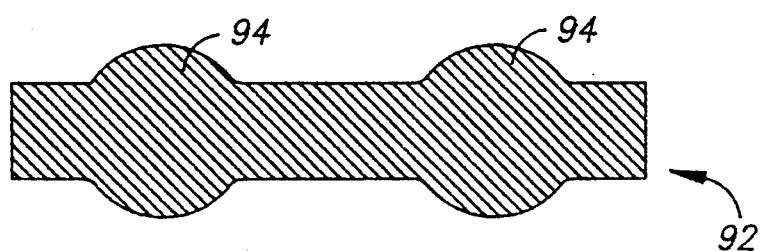

Referring now also to FIGS. 9a and 9b, dot arrays are not the only patterns that would be expected to exhibit the GMR effects discussed above. In general, an antiferromagnetic magnetostatic interaction between magnetic layers in a multilayer structure will occur whenever there is a discontinuity, or break, in the multilayer such that some component of the preferential direction of the magnetization (as determined by some anisotropy of the structure, such as shape, crystalline structure, surface feature or induced) is perpendicular to that discontinuity. Almost the only patterned structure that will not tend to order antiferromagnetically is an elongated line structure with edges everywhere parallel and an easy axis along the length of the line, for example, the typical prior art MR stripe structure. The frequency and size of the discontinuities will determine the interaction field between layers. Complex multi-domain behavior may be exhibited in some structures. Other structures, such as an array 91 of holes or other apertures 93 formed in the multilayered film, as shown in FIG. 9a, or lines of modulated width such as the array 92 of connected or joined dots 94, as shown in FIG. 9b, are expected to provide simple, large-scale GMR devices that may find applications in addition to MR read heads used in magnetic recording systems.

Figure 10:
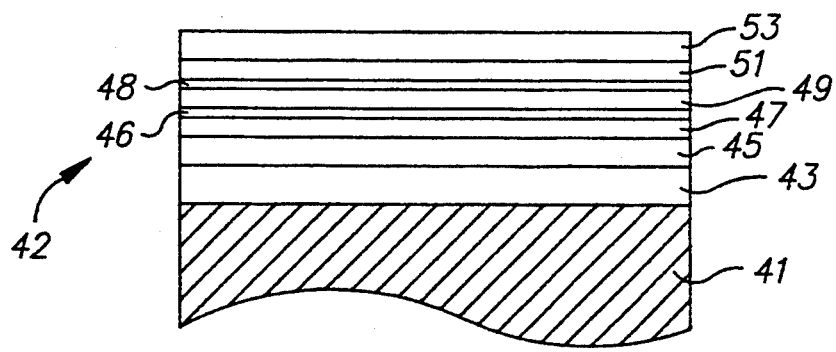
FIGS. 10 and 11 are cross-sectional views illustrating the layered structure of additional preferred embodiments of the magnetoresistive sensing element shown in FIGS. 4 and 5.
Figure 11:
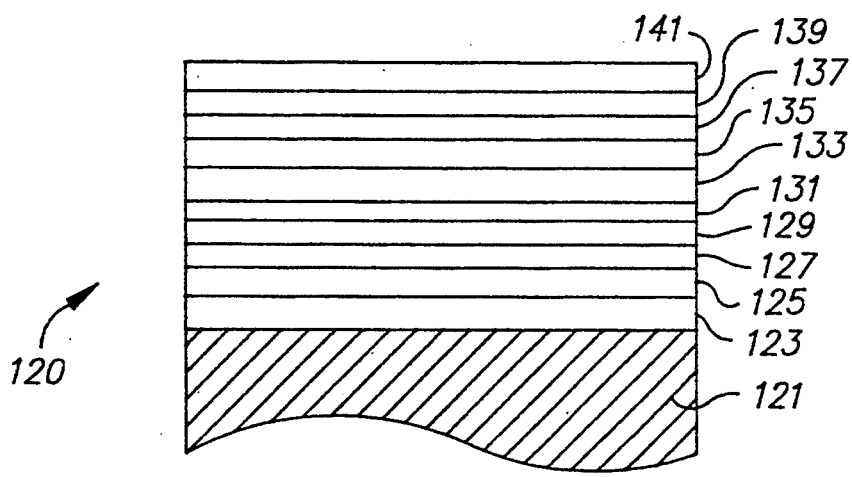

Referring now also to FIG. 10, another preferred embodiment of the present invention is shown. The magnetic layers 47 and 51 of magnetic material separated by a nonmagnetic spacer layer 49. The magnetoresistance of the structure is enhanced by the addition of a very thin layer of magnetic material at the interfaces between the magnetic layers 47, 51 and the spacer layer 51. For example, a thin layer 46, 48 of cobalt (Co) formed at the interfaces between the NiFe layers 47, 51 and the spacer layer 49 of structure 40 significantly increases the observed magnetoresistance of the structure Referring now also to FIG. 11, another preferred embodiment of the present invention comprises a multilayer magnetic structure of n magnetic layers and having the general structure $$Ta(100)/\sum_{j=1}^{n-1} [NiFe(x_j)/Ag(y)]/NiFe(x_n)/Ta(40)/SiO_2(1000)/Si$$

where x, y=10-400 Å, n=2-10 and $$\sum_{j \, even} x_j = \sum_{j \, odd} x_j$$

i.e., the total thickness of the even-numbered layers is equal to the total thickness of the odd-numbered layers. For example, magnetic layers 127, 131, 135, 139 of NiFe alternate with nonmagnetic spacer layers 129, 133, 137 of Ag with a cap layer 141 and an underlayer 125 of Ta are formed on a surface layer 123 of SiO$_2$ over a suitable substrate 121 with a cap layer 141 and an underlayer 125 of Ta are formed on a surface layer 123 of SiO$_2$ over a suitable substrate 121 of Si. Any suitable ferromagnetic material, such as Fe, Ni, Co, or their alloys can be used for the magnetic layer material. Similarly, any suitable nonmagnetic material such as Au or Cu, for example, can be used for the nonmagnetic spacer layer material. As described above with reference to FIGS. 4 and 5, arrays of dots or other suitable shapes having a major dimension of 10.0 μm or less, the maximum length being limited such that the net interaction between the layers is antiferromagnetic (as shown in FIG. 3, for example) are prepared using photolithographic and milling or etching techniques. Then a conduction layer (as shown in FIG. 5) is deposited over the dot array filling in the spaces between the dots in the array to provide electrical conductivity across the structure. Other patterned arrays, such as described above with reference to FIGS. 9a and 9b, for example, are also suitable. In patterned structures which retain continuity within the magnetic layers, such as the array 91 of holes or the line of modulated width 92, a conduction layer 57 is not required. For patterned structures of this type, only a capping layer may be required.

Figure 12:
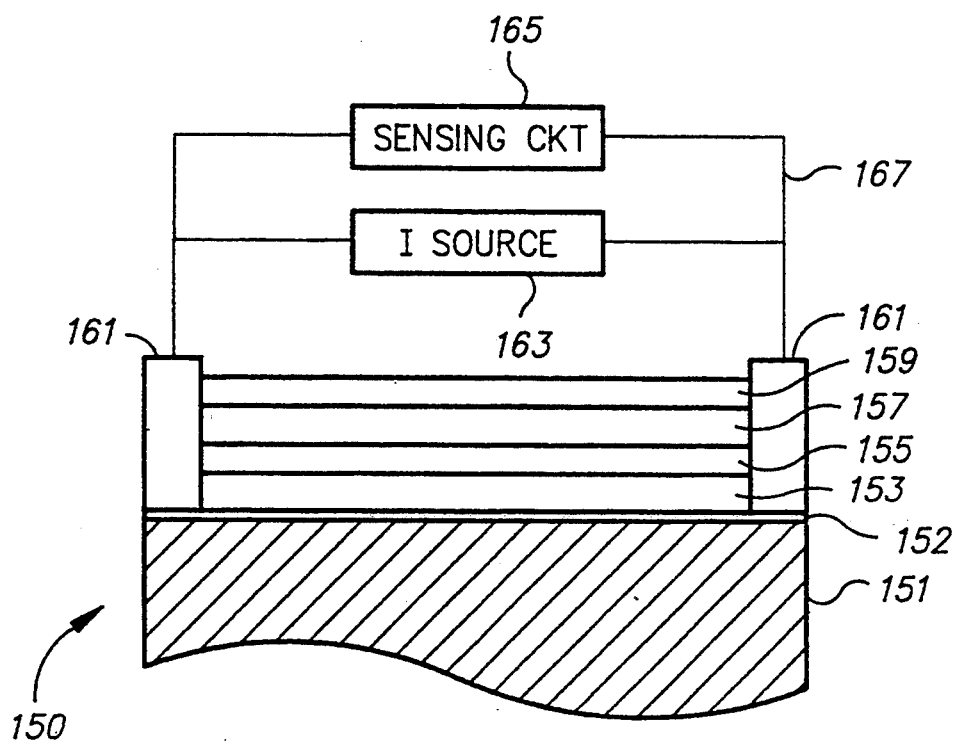
FIG. 12 is a cross-sectional view of a preferred embodiment of a magnetoresistive magnetic sensor system according to the principles of the present invention.

Referring now also to FIG. 12, an MR magnetic sensor incorporating the multilayer sensing element according to the principles of the present invention is shown. The MR sensor 150 comprises a magnetic bias layer 153 of a magnetic material, a nonmagnetic spacer layer 155 and multilayered MR sensor layer 157 deposited on a suitable substrate 151. The substrate 151 may be glass, sapphire, quartz, magnesium oxide, silicon, silicon dioxide, $Al_2O_3$—TiC or other suitable material. An underlayer 152 is first deposited over the substrate 153. The purpose of the underlayer 152 is to optimize the texture, grain size and morphology of the subsequently deposited magnetic layers 153 and 155. The underlayer 152 must have a high resistivity to minimize electrical current shunting effects. Generally, nonmagnetic, high resistivity materials such as tantalum (Ta), ruthenium (Ru) or aluminum oxide, for example, are suitable materials for the underlayer 152. A capping layer 159 of Ta or other suitable material, such as $SiO_2$ or $AlO_2$, for example, is deposited over the MR sensor layer 157 to provide corrosion protection and isolation from subsequent layers and processing steps.

The multilayer MR sensor layer 157 comprises alternating magnetic and nonmagnetic layers which have been patterned in a dot array, for example, as described above with reference to FIGS. 4, 5, 10 and 11. In a preferred embodiment, the MR sensor layer 157 will comprise a single generally square or rectangular dot element having the appropriate length and width as determined by the desired data track width and the requirement to provide an antiferromagnetic interaction field between the magnetic layers. The multilayered MR sensor layer 157 preferably comprises 1–10 bilayers of magnetic and nonmagnetic material deposited over a base layer of magnetic material. The magnetic layers are of ferromagnetic material, preferably NiFe, but can be of any suitable ferromagnetic material such as Ni, Co, Fe and ferromagnetic alloys based on Ni, Fe or Co, for example. The spacer layers preferably are of a nonmagnetic, metallic conductive material such as Au, Ag or Cu, for example, but can be of any nonmagnetic material having suitable conductivity or thin enough to allow transmission of conduction electrons.

The bias layer 153 provides a transverse magnetic bias field for the MR sensor layer 157 to provide a linear response for the sensor. As is known in the art, the bias layer may be of a magnetically hard material (hard bias), such as CoPt or CoPtCr, for example, or of a magnetically soft material (soft bias), such as NiFe or NiFeRh, for example. The spacer layer 155 serves to magnetically decouple the bias layer 153 from the MR sensing layer 157 and also to optimize the texture, grain size and morphology of the MR sensing layer. The spacer layer 155 should be of a nonmagnetics, high resistivity material such as Ta, Zr, Ti, Y, Hf or other suitable material having the desired crystalline structure.

A preferred embodiment of the MR sensor 150 comprises a patterned multilayer MR sensor layer 157 of 5 bilayers of NiFe(20Å)/Ag(35 Å) on a base layer of NiFe(20 Å), a soft bias layer 153 of NiFe deposited on an underlayer 152 of $Al_2O_3$ and separated from the MR sensor layer 157 by a spacer layer 155 of Ta having a thickness of approximately 50 Å. The MR sensor 150 is deposited on a ceramic substrate 151 by sputter deposition or other suitable deposition process as is known in the art. The thickness of the underlayer 152 preferably is in the range of 100 to 500 Å. The NiFe soft bias layer 153 thickness is in the range of 50–300 Å, preferably 100 Å. Conductor terminals 161 of Cu or other suitable material, such as Ta, Ag or Au, formed at opposite ends of the MR sensor 150 connect the MR sensor to current source 163 and signal sensing circuitry 165 via lead conductors 167. The current source 163 provides a sense current to the MR sensor 150 which senses the changes in resistance of the MR sensor element 157 when an external magnetic field is applied. A capping layer 159 of a high resistivity material such as Ta or Zr, for example, can also be deposited over the MR sensor layer 157.

While the present invention has been particularly shown and described with reference to preferred embodiments thereof, it will be understood by those skilled in the art that various changes in form and detail may be made therein without departing from the spirit, scope and teaching of the invention. For example, while the preferred embodiment shown is described as an unshielded device, the MR sensor of the present invention is equally applicable to a shielded or flux-guided structure. Accordingly, the invention herein disclosed is to be considered merely as illustrative and limited in scope only as specified in the appended claims.

We claim:

1. A multilayer magnetoresistive sensor comprising a first and second layer of ferromagnetic material separated by a layer of nonmagnetic material forming a multilayered magnetic structure, said multilayered magnetic structure being patterned to form a multiple element planar array, each element of said array being separated from adjacent elements by a space, a conduction layer of electrically conductive material being formed over said array, said electrically conductive material filling the spaces between said elements for providing electrical conductivity between said elements in the plane of said multilayered magnetic structure, said first and second ferromagnetic layers of each said element being antiferromagnetically coupled by magnetostatic coupling at opposing edges thereof, an interaction field including components of said magnetostatic coupling and an exchange coupling existing between said first and second ferromagnetic layers of each said element, the net interaction field between said first and second ferromagnetic layers being antiferromagnetic, the magnetization in said first ferromagnetic layer being oriented substantially antiparallel to the magnetization in said second ferromagnetic layer, the direction of magnetization in each ferromagnetic layer rotating in response to an applied magnetic field, the resistance of said magnetoresistive sensor varying as a function of the change in the angle between the directions of magnetization in adjacent ferromagnetic layers.

2. A multilayer magnetoresistive sensor as in claim 1 wherein each said element of said array has a desired shape with the largest dimension in the plane of said multilayered magnetic structure being less than 10.0 micrometers.

3. A multilayer magnetoresistive sensor as in claim 2 wherein each said element has a generally circular shape.

4. A multilayer magnetoresistive sensor as in claim 2 wherein each said element has a generally rectangular shape.

5. A multilayer magnetoresistive sensor as in claim 1 wherein said multilayered magnetic structure is patterned to form an array of discontinuities perpendicular to said ferromagnetic layers and intercepting the magnetic anisotropy direction in each said ferromagnetic layer.

6. A multilayer magnetoresistive sensor as in claim 5 wherein said multilayered magnetic structure is patterned to form an array of apertures through said multilayered magnetic structure.

7. A multilayer magnetoresistive sensor as in claim 6 wherein said array of apertures form an array of generally circular holes through said multilayered magnetic structure.

8. A multilayer magnetoresistive sensor as in claim 5 wherein said multilayered magnetic structure is patterned to form at least one strip having a modulated width.

9. A multilayer magnetoresistive sensor as in claim 8 wherein said strip having modulated width comprises an array of connected generally circular elements.

10. A multilayer magnetoresistive sensor as in claim 1 wherein each said element of said array comprises a generally circular element having a maximum diameter of 10.0 micrometers.

11. A multilayer magnetoresistive sensor as in claim 1 wherein each said element of said array has a generally rectangular shape with the largest dimension being less than 10 micrometers.

12. A multilayer magnetoresistive sensor as in claim 1 wherein said ferromagnetic material comprises a material selected from the group consisting of iron, cobalt, nickel, nickel-iron and ferromagnetic alloys based on iron, cobalt, nickel or nickel-iron.

13. A multilayer magnetoresistive sensor as in claim 12 wherein said ferromagnetic material comprises nickel-iron.

14. A multilayer magnetoresistive sensor as in claim 1 wherein said nonmagnetic layer comprises an electrically conductive material.

15. A multilayer magnetoresistive sensor as in claim 14 wherein said electrically conductive material is a material selected from the group consisting of silver, gold, copper and ruthenium and conductive alloys of silver, gold, copper or ruthenium.

16. A multilayer magnetoresistive sensor as in claim 15 wherein sa id electrically conductive material is silver.

17. A multilayer magnetoresistive sensor as in claim 15 wherein sa id electrically conductive material is copper.

18. A multilayer magnetoresistive sensor as in claim 1 wherein said conduction layer comprises a nonmagnetic electrically conductive material selected from the group consisting of chromium, tantalum, silver, gold, copper, aluminum and ruthenium.

19. A multilayer magnetoresistive sensor as in claim 18 wherein said nonmagnetic electrically conductive material comprises chromium.

20. A multilayer magnetoresistive sensor comprising N bilayers wherein each bilayer comprises a layer of ferromagnetic material formed over a layer of nonmagnetic material, said N bilayers formed over a base layer of said ferromagnetic material thereby forming a multilayered magnetic structure of alternating layers of ferromagnetic material and nonmagnetic material, the top layer and the base layer being of ferromagnetic material, each ferromagnetic layer being antiferromagnetically coupled to the adjacent ferromagnetic layers by magnetostatic coupling at opposing edges thereof, an interaction field including components of said magnetostatic coupling and an exchange coupling existing between adjacent ferromagnetic layers, the net interaction field between adjacent ferromagnetic layers being antiferromagnetic, the magnetization in a ferromagnetic layer being oriented antiparallel to the magnetization in the adjacent ferromagnetic layers, the direction of magnetization in each ferromagnetic layer rotating in response to an applied magnetic field, the resistance of said magnetoresistive sensor varying as a function of the change in the angle between the directions of magnetization in adjacent ferromagnetic layers.

21. A multilayer magnetoresistive sensor as in claim 20 further comprising a capping layer formed over the top layer of said multilayered magnetic structure.

22. A multilayer magnetoresistive sensor as in claim 21 further wherein said capping layer comprises a nonmagnetic high resistivity material selected from the group consisting of tantalum, silicon dioxide and aluminum oxide.

23. A multilayer magnetoresistive sensor as in claim 21 wherein said multilayered magnetic structure is patterned to form a multiple element planar array, each element of said art ay being separated from adjacent elements by a space, each element of said array having the same layered structure as said multilayered magnetic structure, a conduction layer of electrically conductive material being formed over said array, said electrically conductive material filling the spaces between said elements for providing electrical conductivity between said elements in the plane of said multilayered magnetic structure.

24. A multilayer magnetoresistive sensor as in claim 23 wherein said elements of said array have a desired shape with the largest dimension in the plane of said multilayered magnetic structure being less than 10.0 micrometers.

25. A multilayer magnetoresistive sensor as in claim 24 wherein each said element comprises a generally circular element having a maximum diameter of 10.0 micrometers.

26. A multilayer magnetoresistive sensor as in claim 24 wherein each said element has a generally rectangular shape.

27. A multilayer magnetoresistive sensor as in claim 20 wherein said multilayered magnetic structure is patterned to form an array of discontinuities perpendicular to said ferromagnetic layers and intercepting the magnetic anisotropy direction in each said ferromagnetic layer.

28. A multilayer magnetoresistive sensor as in claim 27 wherein said multilayered magnetic structure is patterned to form an array of apertures through said multilayered magnetic structure.

29. A multilayer magnetoresistive sensor as in claim 28 wherein said array of apertures form an array of generally circular holes through said multilayered magnetic structure.

30. A multilayer magnetoresistive sensor as in claim 27 wherein said multilayered magnetic structure is patterned to form at least one strip having a modulated width.

31. A multilayer magnetoresistive sensor as in claim 30 wherein said strip having modulated width comprises an array of connected generally circular elements.

32. A multilayer magnetoresistive sensor as in claim 21 wherein said ferromagnetic material comprises a material selected from the group consisting of iron, cobalt, nickel, nickel-iron and ferromagnetic alloys based on iron, cobalt, nickel or nickel-iron.

33. A multilayer magnetoresistive sensor as in claim 32 wherein said ferromagnetic material comprises nickel-iron.

34. A multilayer magnetoresistive sensor as in claim 21 wherein said nonmagnetic material comprises an electrically conductive material.

35. A multilayer magnetoresistive sensor as in claim 34 wherein said electrically conductive material is a material selected from the group consisting of silver, gold, copper and ruthenium and conductive alloys of silver, gold, copper or ruthenium.

36. A multilayer magnetoresistive sensor as in claim 35 wherein said electrically conductive material is silver.

37. A multilayer magnetoresistive sensor as in claim 35 wherein said electrically conductive material is copper.

38. A multilayer magnetoresistive sensor as in claim 23 wherein said conduction layer comprises a nonmagnetic electrically conductive material selected from the group consisting of chromium, tantalum, silver, gold, copper, aluminum and ruthenium and conductive alloys of chromium, tantalum, silver, gold, copper, aluminum or ruthenium.

39. A multilayer magnetoresistive sensor as in claim 38 wherein said nonmagnetic electrically conductive material comprises chromium.

40. A multilayer magnetoresistive sensor as in claim 38 wherein said nonmagnetic electrically conductive material comprises tantalum.

41. A multilayer magnetoresistive sensor as in claim 21 wherein N is selected from the range of 2 to 10.

42. A multilayer magnetoresistive sensor as in claim 21 wherein the sum of the thicknesses of the odd-numbered ferromagnetic layers substantially equals the sum of the thicknesses of the even-numbered ferromagnetic layers.

43. A multilayer magnetoresistive sensor as in claim 42 wherein the thickness of said top and base layers of ferromagnetic material is substantially one-half the thickness of the ferromagnetic layers within said multilayered imagnetic structure.

44. A multilayer magnetoresistive sensor comprising:
a substrate;
an isolation layer deposited on a major surface of said substrate;
a bias layer of a magnetic material deposited on said isolation layer;
a magnetoresistive sensing element deposited over said bias layer and comprising a plurality of N bilayers wherein each bilayer comprises a layer of ferromagnetic material, formed over a layer of nonmagnetic material, said N bilayers formed over a base layer of said ferromagnetic material thereby forming a multilayered magnetic structure of alternating layers of ferromagnetic material and nonmagnetic material, the top layer and the base layer being of ferromagnetic material, each ferromagnetic layer being antiferromagnetically coupled to the adjacent ferromagnetic layers by magnetostatic coupling at opposing edges thereof, an interaction field including components of said magnetostatic coupling and an exchange coupling existing between adjacent ferromagnetic layers, the net interaction field between adjacent ferromagnetic layers being antiferromagnetic, the magnetization in a ferromagnetic layer being oriented substantially antiparallel to the magnetization in the adjacent ferromagnetic layers, the direction of magnetization in each ferromagnetic layer rotating in response to an applied magnetic field, the resistance of said magnetoresistive sensor varying as a function of the change in the angle between the directions of magnetization in adjacent ferromagnetic layers, said multilayered magnetic structure being patterned to form a multiple element planar array, each element of said array being separated from adjacent elements by a space, each element of said array having the same layered structure as said multilayered magnetic structure, a conduction layer of electrically conductive material being formed over said array, said electrically conductive material filling the spaces between said elements for providing electrical conductivity between said elements in the plane of said multilayered magnetic structure;
a capping layer formed over the top layer of said multilayered magnetic structure; and
a spacer layer of a nonmagnetic material deposited on said bias layer and disposed between said bias layer and said magnetoresistive sensing element for magnetically decoupling said bias layer from said magnetoresistive sensing element.

45. A multilayer magnetoresistive sensor as in claim 44 wherein the number N of bilayers is selected from a range of 1 to 10.

46. A multilayer magnetoresistive sensor as in claim 44 wherein each said element comprises a generally circular element having a maximum diameter of 10.0 micrometers.

47. A multilayer magnetoresistive sensor as in claim 44 wherein each said element comprises a generally rectangular element having a maximum dimension of less than 10 micrometers.

48. A multilayer magnetoresistive sensor as in claim 44 wherein said ferromagnetic material comprises a material selected from the group consisting of iron, cobalt, nickel, nickel-iron and ferromagnetic alloys based on iron, cobalt, nickel or nickel-iron.

49. A multilayer magnetoresistive sensor as in claim 48 wherein said ferromagnetic material comprises nickel-iron.

50. A multilayer magnetoresistive sensor as in claim 44 wherein said nonmagnetic layers comprise an electrically conductive material selected from the group consisting of silver, gold, copper and ruthenium and conductive alloys of silver, gold, copper or ruthenium.

51. A multilayer magnetoresistive sensor as in claim 50 wherein said electrically conductive material is silver.

52. A multilayer magnetoresistive sensor as in claim 44 wherein said spacer layer comprises a material selected from the group consisting of tantalum, zirconium, titanium, yttrium and hafnium.

53. A multilayer magnetoresistive sensor as in claim 52 wherein said spacer layer comprises tantalum.

54. A multilayer magnetoresistive sensor as in claim 44 wherein said bias layer comprises a layer of magnetically soft material for providing said magnetic bias field.

55. A multilayer magnetoresistive sensor as in claim 54 wherein said magnetically soft material comprises a material selected from the group consisting of nickel-iron and nickel-iron-rhodium.

56. A multilayer magnetoresistive sensor as in claim 44 wherein said bias layer comprises a layer of magnetically hard material for providing said magnetic bias field.

57. A multilayer magnetoresistive sensor as in claim 56 wherein said magnetically hard material comprises a material selected from the group consisting of cobalt-platinum and cobalt-platinum-chromium.

58. A multilayer magnetoresistive sensor as in claim 44 wherein said ferromagnetic layers have a thickness within the range of about 10 angstroms to about 100 angstroms.

59. A multilayer magnetoresistive sensor as in claim 44 wherein said nonmagnetic layers have a thickness within the range of about 10 angstroms to about 400 angstroms.

60. A multilayer magnetoresistive sensor as in claim 44 wherein said conduction layer comprises a nonmagnetic electrically conductive material selected from the group consisting of chromium, tantalum, silver, gold, copper, aluminum and ruthenium and conductive alloys of chromium, tantalum, silver, gold, copper, aluminum or ruthenium.

61. A multilayer magnetoresistive sensor as in claim 60 wherein said nonmagnetic electrically conductive material comprises tantalum.

62. A multilayer magnetoresistive sensor as in claim 44 wherein the sum of the thicknesses of the odd-numbered ferromagnetic layers substantially equals the sum of the thicknesses of the even-numbered ferromagnetic layers within said multilayered magnetic structure.

63. A magnetic storage system comprising:
a magnetic storage medium having a plurality of tracks defined on a surface thereof for recording of data;
a magnetic transducer maintained in a closely spaced position relative to said magnetic storage medium during relative motion between said magnetic transducer and said magnetic storage medium, said magnetic transducer including a multilayer magnetoresistive sensor comprising a magnetoresistive sensing element including a plurality of N bilayers wherein each bilayer comprises a layer of ferromagnetic material formed over a layer of nonmagnetic material, said N bilayers formed over a base layer of said ferromagnetic material thereby forming a multilayered magnetic structure of alternating layers of ferromagnetic material and nonmagnetic material, the top layer and the base layer being of ferromagnetic material, each ferromagnetic layer being antiferromagnetically coupled to the adjacent ferromagnetic layers by magnetostatic coupling at opposing edges thereof, an interaction field including components of said magnetostatic coupling and an exchange coupling existing between adjacent ferromagnetic layers, the net interaction field between adjacent ferromagnetic layers being antiferromagnetic, the magnetization in a ferromagnetic layer being oriented substantially antiparallel to the magnetization in the adjacent ferromagnetic layers, the direction of magnetization in each ferromagnetic layer rotating in response to an applied magnetic field, the resistance of said magnetoresistive sensor varying as a function of the change in the angle between the directions of magnetization in adjacent ferromagnetic layers, said multilayered magnetic structure being patterned to form a multiple element planar array, each element of said array being separated from adjacent elements by a space, each element of said array having the same layered structure as said multilayered magnetic structure, a conduction layer of electrically conductive material being formed over said array, said electrically conductive material filling the spaces between said elements for providing electrical conductivity between said elements in the plane of said multilayered magnetic structure, a bias layer of a magnetic material for providing a magnetic bias field for said magnetoresistive sensing element, a spacer layer of a nonmagnetic materal disposed between said bias layer and said base layer of said magnetoresistive sensing element magnetically decoupling said bias layer from said magnetoresistive sensing element, and conductive leads connected to opposite ends of said magnetoresistive sensing element, respectively, for connecting said multilayer magnetoresistive sensor to external circuitry and for coupling a sense current to said magnetoresistive sensing element;
actuator means coupled to said magnetic transducer for moving said magnetic transducer to selected data tracks on said magnetic storage medium; and
detection means coupled to said multilayer magnetoresistive sensor for detecting resistance changes in said magnetoresistive sensing element responsive to applied magnetic fields representative of data bits recorded in said magnetic storage medium intercepted by said multilayer magnetoresistive sensor.

64. A magnetic storage system as in claim 63 wherein the number N of bilayers is selected from a range of 1 to 10.

65. A magnetic storage system as in claim 63 wherein each said element comprises a generally circular element having a maximum diameter of 10.0 micrometers.

66. A magnetic storage system as in claim 63 wherein each said element comprises a generally rectangular element having a maximum dimension of less than 10 micrometers.

67. A magnetic storage system as in claim 63 wherein said multilayer magnetoresistive sensor comprises a single element, a maximum dimension of said single element being substantially equal to the data track width.

68. A magnetic storage system as in claim 63 wherein said ferromagnetic material comprises a material selected from the group consisting of iron, cobalt, nickel, nickel-iron and ferromagnetic alloys based on iron, cobalt, nickel or nickel-iron.

69. A magnetic storage system as in claim 68 wherein said ferromagnetic material comprises nickel-iron.

70. A magnetic storage system as in claim 63 wherein said nonmagnetic layers comprise an electrically conductive material selected from the group consisting of silver, gold, copper and ruthenium and conductive alloys of silver, gold, copper or ruthenium.

71. A magnetic storage system as in claim 70 wherein said electrically conductive material is silver.

72. A magnetic storage system as in claim 63 wherein said spacer layer comprises a material selected from the group consisting of tantalum, zirconium, titanium, yttrium and hafnium.

73. A magnetic storage system as in claim 63 wherein said bias layer comprises a layer of magnetically soft material for providing said magnetic bias field, said magnetically soft material selected from the group consisting of nickel-iron-chromium, nickel-iron-niobium, nickel-iron and nickel-iron-rhodium.

74. A magnetic storage system as in claim 63 wherein said bias layer comprises a layer of magnetically hard material for providing said magnetic bias field, said magnetically hard material selected from the group consisting of cobalt-platinum and cobalt-platinum-chromium.

75. A magnetic storage system as in claim 63 wherein said ferromagnetic layers have a thickness within the range of about 10 angstroms to about 100 angstroms.

76. A magnetic storage system as in claim 63 wherein said nonmagnetic layers have a thickness within the range of about 10 angstroms to about 400 angstroms.

77. A magnetic storage system as in claim 63 wherein said conduction layer comprises a nonmagnetic electrically conductive material selected from the group consisting of chromium, tantalum, silver, gold, copper, aluminum and ruthenium and conductive alloys of chromium, tantalum, silver, gold, copper, aluminum or ruthenium.

78. A method for manufacturing a multilayer magnetoresistive structure for use in a magnetoresistive sensor, said multilayer magnetoresistive structure comprising a planar array of magnetoresistive elements, each said magnetoresistive element having a plurality of ferromagnetic layers, each said ferromagnetic layer separated by a spacer layer of nonmagnetic material, each said magnetoresistive element in said array of magnetoresistive elements separated from adjacent magnetoresistive elements by a space, a layer of conductive material formed over and between said magnetoresistive elements, said conductive material filling the spaces between said magnetoresistive elements, said method comprising the steps of:

forming a base layer of ferromagnetic material on a substrate;

forming a plurality of bilayers, each said bilayer comprising a first layer of a nonmagnetic material and a second layer of said ferromagnetic material formed on said first layer, said plurality of bilayers formed on said base layer of said ferromagnetic material;

patterning the resulting multilayered magnetic structure forming a multiple element planar array, each element of said array being separated from adjacent elements by a space, each element of said array having the same layered structure as said multilayered magnetic structure; and forming a conduction layer of electrically conductive material over said array, said electrically conducive material filling the spaces between said elements for providing electrical conductivity between said elements in the plane of the multilayered magnetic structure.

79. The method of claim 78 wherein said ferromagnetic layers have a thickness within .the range of about 10 angstroms to about 100 angstroms.

80. The method of claim 78 wherein said nonmagnetic layers have thickness within the range of about 10 angstroms to about 400 angstroms.

81. A multilayer magnetoresistive sensor comprising:
a substrate;
an isolation layer deposited on a major surface of said substrate;
a bias layer of a magnetic material deposited on said isolation layer;
a magnetoresistive sensing element deposited over said bias layer and comprising a plurality of N bilayers wherein each bilayer comprises a layer of ferromagnetic material formed on a layer of nonmagnetic material, said N bilayers formed on a base layer of said ferromagnetic material thereby forming a multilayered magnetic structure of alternating layers of ferromagnetic material and nonmagnetic material, the top layer and the base layer being of ferromagnetic material, each ferromagnetic layer being antiferromagnetically coupled to the adjacent ferromagnetic layers by magnetostatic coupling at opposing edges thereof, an interaction field including components of said magnetoresistive coupling and an exchange coupling existing between adjacent ferromagnetic layers, the net interaction field between adjacent ferromagnetic layers being antiferromagnetic, the magnetization in a ferromagnetic layer being oriented substantially antiparallel to the magnetization in the adjacent ferromagnetic layers, the direction of magnetization in each ferromagnetic layer rotating in response to an applied magnetic field, the resistance of said magnetoresistive sensor varying as a function of the change in the angle between the directions of magnetization in adjacent ferromagnetic layers, said multilayered magnetic structure being patterned to form a single magnetoresistive element, said magnetoresistive element having a maximum dimension substantially equal to a desired data track width;
a capping layer formed over the top layer of said multilayered magnetic structure; and
a spacer layer of a nonmagnetic material deposited on said bias layer and disposed between said bias layer and said magnetoresistive sensing element for magnetically decoupling said bias layer from said magnetoresistive sensing element.

82. A multilayer magnetoresistive sensor as in claim 81 wherein the number N of bilayers is selected from a range of 1 to 10.

83. A multilayer magnetoresistive sensor as in claim 81 wherein said ferromagnetic material comprises a material selected from the group consisting of iron, cobalt, nickel, nickel-iron and ferromagnetic alloys based on iron, cobalt, nickel or nickel-iron.

84. A multilayer magnetoresistive sensor as in claim 81 wherein said nonmagnetic layers comprise an electrically conductive material selected from the group consisting of silver, gold, copper and ruthenium and conductive alloys of silver, gold, copper or ruthenium.

85. A multilayer magnetoresistive sensor as in claim 81 wherein said spacer layer comprises a material selected from the group consisting of tantalum, zirconium, titanium, yttrium and hafnium.

86. A multilayer magnetoresistive sensor as in claim 81 wherein said bias layer comprises a layer of magnetically soft material for providing said magnetic bias field, said magnetically soft material selected from the group consisting of nickel-iron-chromium, nickel-iron-niobium, nickel-iron and nickel-iron-rhodium.

87. A multilayer magnetoresistive sensor as in claim 81 wherein said bias layer comprises a layer of magnetically hard material for providing said magnetic bias field, said magnetically hard material selected from the group consisting of cobalt-platinum and cobalt-platinum-chromium.

88. A multilayer magnetoresistive sensor as in claim 81 wherein said ferromagnetic layers have a thickness within the range of about 10 angstroms to about 100 angstroms.

89. A multilayer magnetoresistive sensor as in claim 81 wherein said nonmagnetic layers have a thickness within the range of about 10 angstroms to about 400 angstroms.

* * * * *

UNITED STATES PATENT AND TRADEMARK OFFICE
CERTIFICATE OF CORRECTION

PATENT NO. : 5,452,163
DATED : September 19, 1995
INVENTOR(S) : Coffey et al.

It is certified that error appears in the above-indentified patent and that said Letters Patent is hereby corrected as shown below:

Column 11, line 64, delete space between "sa and id".

Column 12, line 44, delete "art ay", insert --array--.

Signed and Sealed this

Twenty-third Day of January, 1996

Attest:

BRUCE LEHMAN

Attesting Officer     Commissioner of Patents and Trademarks